United States Patent [19]

Torma

[11] Patent Number: 4,917,579

[45] Date of Patent: Apr. 17, 1990

[54] TRANSPORTER PUMP

[75] Inventor: Mikael Torma, Olten, Switzerland

[73] Assignee: KAILEG AB, Malmo, Sweden

[21] Appl. No.: 319,081

[22] PCT Filed: Jun. 23, 1988

[86] PCT No.: PCT/SE88/00354

§ 371 Date: Feb. 22, 1989

§ 102(e) Date: Feb. 22, 1989

[87] PCT Pub. No.: WO88/10371

PCT Pub. Date: Dec. 29, 1988

[30] Foreign Application Priority Data

Jun. 24, 1987 [SE] Sweden ................................ 8702613

[51] Int. Cl.⁴ ............................................. F04B 43/12
[52] U.S. Cl. .................................... 417/322; 417/474;
417/478; 310/26; 310/366; 310/267; 310/269;
310/328
[58] Field of Search ....................... 417/322, 478, 474;
310/267, 269, 26, 366, 328

[56] References Cited

U.S. PATENT DOCUMENTS

| | | |
|---|---|---|
| 2,317,166 | 4/1943 | Abrams . |
| 2,786,416 | 3/1957 | Fenemore .............................. 417/50 |
| 3,924,974 | 12/1975 | Fischbeck et al. . |
| 4,115,036 | 9/1978 | Paterson . |
| 4,308,546 | 12/1981 | Halasz ................................. 310/369 |
| 4,449,893 | 5/1984 | Beckman et al. . |
| 4,499,479 | 2/1985 | Lee et al. ............................. 310/369 |
| 4,822,250 | 4/1989 | Tsubouchi et al. .................. 417/322 |

FOREIGN PATENT DOCUMENTS

| | | | |
|---|---|---|---|
| 3007001 | 9/1981 | Fed. Rep. of Germany . | |
| 0588398 | 1/1978 | U.S.S.R. .............................. | 417/322 |
| 1116510 | 9/1984 | U.S.S.R. .............................. | 417/474 |

Primary Examiner—Donald E. Stout
Assistant Examiner—David W. Scheuermann
Attorney, Agent, or Firm—Fleit, Jacobson, Cohn, Price, Holman & Stern

[57] ABSTRACT

A transporter includes at least one elongated transporting element (1) which is made of a material capable of changing its volume in response to the application of voltage or magnetic fields thereacross. The transporting element, optionally together with a further transporting element or some other part of the transporter, defines an elongated transporting channel (7). Means are provided for generating fields in predetermined regions along the transporting element (1) and in a given order of sequence, such as to impart substantially peristaltic motion to the element. These means include at least three mutually adjacent conductors (3, 4, 5) which extend substantially helically in relation to the transporting element (1) and to which different phases of a multiphase alternating voltage or alternating current source are applied.

5 Claims, 1 Drawing Sheet

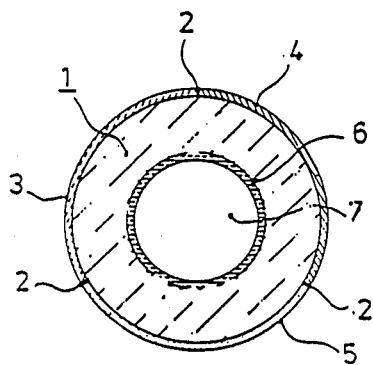
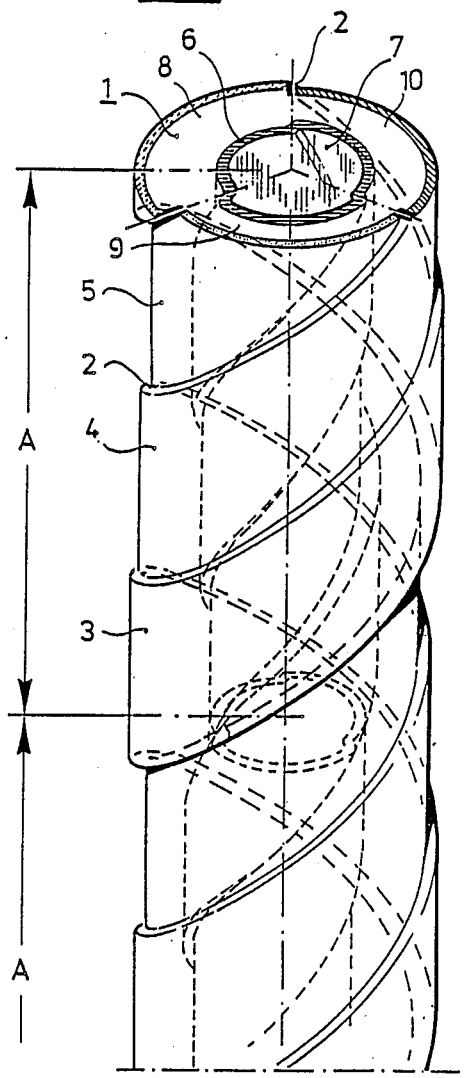
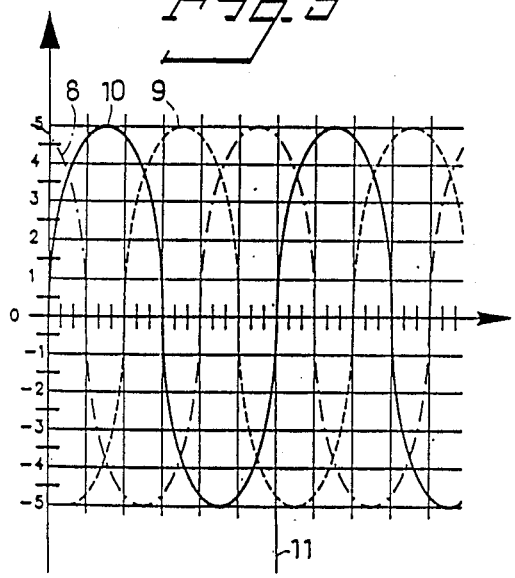

TRANSPORTER PUMP

The present invention relates to a transporter of the kind which includes at least one elongated transporting element which is made of a material capable of changing its volume in response to the application of voltage or magnetic fields thereacross, wherewith a transporting element, optionally together with a further transporting element or some other part of the transporter, defines an elongated transporting channel, and which transporter further includes means for generating such fields in predetermined regions along said transporting element and in a given order of sequence such as to generate substantially peristaltic motion in said element, said means including at least three conductors which are arranged peripherally in relation to the transporting element and to which different phases of a multi-phase alternating voltage or alternating current are applied.

Known transporters of this kind (cf for instance JP 53-27103) are used normally as pumps for the controlled transportation of relatively small quantities of liquid per unit of time, e.g. for supplying ink to ink jet printers. These known transporters incorporate conductors in the form of three or more mutually adjacent, individual rings or annuli which are distributed along the length of the transporting element and extend perpendicular to the direction of transportation, and each of which is coupled to an appropriate phase of an alternating voltage or alternating current source. In order to obtain high pumping pressures, the transporting element must have a considerable length and a relatively large number of conductor rings must be provided, each of which rings needs to be connected to its respective phase in the multi-phase alternating voltage or alternating current source, which complicates the construction and manufacture of the transporter.

One object of the present invention is to provide a novel and advantageous transporter of the aforesaid kind which is simpler and easier to manufacture then known transporters of a similar kind.

Accordingly, it is proposed in accordance with the invention that the aforesaid conductors comprise conductors which extend in mutually adjacent relationship substantially helically in relation to the transporting element. This enables a large number of conductor turns, corresponding to the conductor rings of known transporters, to be readily provided in an advantageous manner with the aid of only a few, e.g. only three, conductors, and requires only a single connection between each conductor, which normally forms many turns along the associated transporting element, and the alternating voltage or current source for operating the transporter.

The helical conductor arrangement gives rise to a component of force which forms an angle with the direction of transportation and therewith tends to rotate the material or medium transported by the transporter. This property can be utilized, for example, to influence ballistically or to stabilize a jet of liquid exiting from the transporting channel when using the transporter as a pump, by suitable selection of the pitch of the helically extending conductors. For the purpose of obtaining high pump pressures or large forces in the direction of transportation, it is preferred to use a small pitch with subsequently many coil turns per unit of length. An advantage is afforded when, in accordance with one feature of the invention, the essentially helical conductors have a pitch which changes abruptly or successively along the length of the transporting element, e.g. increases towards the outlet side of the transporting channel so as, primarily when used as a liquid pump, to first engender a considerable build-up in pressure and then a more pronounced rotational effect, or decreases towards said outlet end so as to engender a stepwise or successive build-up in pressure.

The transporting element, or each transporting element, may be in the form of a tube or rod made of a piezo-electric or magnetostrictive material, e.g. material which is capable of changing its volume in correspondence with a voltage or an electromagnetic field applied thereacross. In the case of a tubular transporting element, conductors may be placed on one or both sides of the element. When using a tubular transporting element which has conductors provided on both sides thereof, each conductor on one side of the element is preferably positioned opposite to a conductor on the other side of the tube and mutually opposite conductors are preferably connected to oppositely directed phases of a multi-phase alternating voltage or alternating current source, to achieve co-action between the conductors. In its simplest form, a transporter may comprise a tube of piezo-electric or magnetostrictive material with externally arranged conductors and may suitably have a circular cross-section. This enables the whole of the central cavity of the tube to form a transporting channel for the transportation of, e.g., a liquid or a continuous string of material. When using externally arranged conductors and a transporting element which is made of piezoelectric material, in which different phases of a relatively high a.c. voltage are passed through the helically extending conductors, the transported medium is also preferably electrically conductive and is connected to earth or a fixed potential, so as to produce a weak, essentially radial flow of current through the transporting element. However, the side of the tube opposite the winding may be provided with an electrically conductive coating which is connected to earth or to a fixed potential, both when the transported medium is electrically conductive and when it is not. The tubular transporting element may optionally have arranged therein a core which is inoperative with regard to transportation of the medium and which defines an annular passage or channel together with the opposing inner wall surface of the transporting element. An annular transporting channel can also be obtained when using two mutually telescopic tubular transporting elements, when using a rod-like transporting element which extends axially in one tubular transporting element and when using a rod-like transporting element which extends axially into a tubular part of the transporter which is inactive with regard to transportation. When the transporter includes a transporting element in the form of an elongated core or a rod made of piezo-electric or magnetostrictive material and said core or rod is accommodated in a tubular transporting element provided with essentially helical conductors on one or both sides thereof, and when said core or rod has at least three mutually adjacent, essentially helically extending conductors provided on the outer surface thereof, each of these latter conductors is preferably located opposite a respective conductor on the tubular transporting element. In this case the conductors on the two transporting elements are supplied with different phases of a multi-phase alternating voltage or current source which are so selected that the two elements will form mutually co-acting transporting elements in the transporter in which they are found.

The invention will now be described with reference to an exemplifying embodiment thereof illustrated in the accompanying drawings.

FIG. 1 is a cross-sectional view, in an enlarged scale, of a transporter constructed in accordance with the invention and shows the transporter in an inactive state.

FIG. 2 is a perspective view of the transporter of FIG. 1, showing the transporter in its operative state.

FIG. 3 is a diagram which shows the reaction of the transporter when a three-phase alternating voltage is applied thereacross.

In FIGS. 1 and 2, the reference 1 designates a tubular body which is made of a piezo-electric material, for instance barium titanite. Applied to the outer surface of the tubular body 1 is a coating of material which has good electrical, conductivity, e.g. a silver coating. The coating is divided by helically extending grooves 2, each filled with electrically insulating material, into three mutually adjacent, helically extending conductors 3, 4, 5. A coating 6 of material having good electrical conductivity is also provided on the inner surface of the tubular body. Each of the conductors 3, 4, 5 is connected, by means not shown, to a respective phase of a three-phase alternating voltage source (also not shown) having a relatively high frequency and voltage. The tubular body 1, with associated conductors 3, 4, 5 and the coating 6, forms only a portion of a transporter and surrounds a transporting channel 7, which in the inoperative state illustrated in FIG. 1 has a cylindrical cross-section. The reference sign A in FIG. 2 designates the pitch of the helically extending conductors 3, 4, 5 and therewith the length of tube utilized for a single winding turn of the three conductors. A transporter constructed in accordance with the invention will normally present a considerable number of winding turns.

When using the transporter, the voltage from each phase of the three-phase a.c. voltage source is applied to a respective conductor 3, 4, 5, therewith bringing the transporter to its active state in the manner illustrated schematically in FIGS. 2 and 3, it being assumed that the coating 6 is earthed. In the case of the FIG. 2 illustration, the momentary voltage on the conductor 4 is substantially zero, whereas the momentary voltage on the conductor 3 is almost at a maximum and positive and the momentary voltage on the conductor 5 is also almost at a maximum but negative. As a result, the tubular body 1 has increased in volume in the region 8 located radially inwards of the conductor 3 and has decreased in volume in the region 9 located radially inwards of the conductor 5, while remaining unchanged in the region 10 located inwardly of the conductor 4, in the manner illustrated in FIG. 1. The volume of the tubular body 1 will change from this illustrated state at respective regions 8, 9, 10 in response to changes in the voltages on the conductors 3, 4, 5.

In the diagram of FIG. 3, in which the horizontal axis is a time axis and the vertical axis shows changes in volume, the regions 8, 9, 10 are represented respectively by a chain line, a plain broken line and a continuous line, the state according to FIG. 2 being illustrated adjacent the vertical axis and at the vertical line or time point 11, the distance of which from the vertical axis corresponds to a complete or full period of the alternating voltage source. Continued supply of three-phase alternating voltage to the conductors 3, 4, 5 will result in an increase and decrease in the volume of the tubular body 1 at the regions 8, 9, 10 at a rhythm and to an extent illustrated by the curves in FIG. 3, the tubular body 1 thus performing a peristaltic movement which can be utilized to transport liquid or a rod through the channel 7 surrounded by the body 1.

It will be understood that the invention is not restricted to the described and illustrated embodiment, but can be realized in any manner within the scope of the inventive concept set forth in the following claims. Thus, it lies within the scope of the invention to combine helically extending conductors with single conductor turns which extend perpendicularly to the direction of transportation and which can be activated, e.g. by applying a d.c. voltage thereto, e.g. in order to open and close the inlet or outlet end of a tubular transporting channel of a transporter in accordance with the invention.

I claim:

1. A transporter which includes at least one elongated transporting element (1) which is made of a material capable of changing its volume in response to the application of voltage or magnetic fields thereacross, wherewith a transporting element, optionally together with a further transporting element or some other part of the transporter, defines an elongated transporting channel (7), and which transporter further includes means for generating such fields in predetermined regions along the transporting element and in a given order of sequence such as to generate substantially peristaltic motion in said element, said means including at least three conductors (3, 4, 5) which are arranged peripherally in relation to the transporting element and to which different phases of a multi-phase alternating voltage or alternating current are applied, characterized in that the conductors (3, 4, 5) comprise conductors which extend in mutually adjacent relationship substantially helically in relation to the transporting element (1).

2. A transporter according to claim 1, characterized in that the pitch of the essentially helically extending conductors (3, 4, 5) varies along the length of the transporting element (1).

3. A transporter according to claim 1, characterized in that the transporting element (1) comprises a tube which is made of a piezo-electric material and which is provided on one side with substantially helically extending conductors (3, 4, 5) and on its other side with a conductive coating (6) which is connected to earth or a source of fixed voltage.

4. A transporter according to claim 1, characterized in that the transporting element (1) comprises a tube which is made of a piezo-electric or magnetostrictive material which is provided on both sides with at least three mutually adjacent, substantially helically extending conductors (3, 4, 5), each conductor on one side of the tube being located substantially opposite a conductor on the opposite side of the tube, and mutually opposite conductors being connected to oppositely directed phases of a multi-phase alternating voltage or alternating current.

5. A transporter according to claim 1, characterized in that it includes a further transporting element in the form of an elongated core which is made of piezo-electric or magnetostrictive material and which is accommodated in a tubular transporting element (1) provided on at least one side thereof with substantially helically extending conductors (3, 4, 5), the further transporting element being provided on its outer surface with at least three mutually adjacent, substantially helically extending conductors each of which is located substantially opposite a respective conductor on the tubular transporting element (1).

* * * * *